(12) United States Patent  
Iwamoto (10) Patent No.: US 8,717,544 B2  
(45) Date of Patent: May 6, 2014

(54) ALIGNMENT METHOD, ALIGNMENT APPARATUS, AND EXPOSURE APPARATUS

(75) Inventor: Takamitsu Iwamoto, Yokohama (JP)

(73) Assignee: V Technology Co., Ltd., Kanagawa (JP)

( * ) Notice: Subject to any disclaimer, the term of this patent is extended or adjusted under 35 U.S.C. 154(b) by 311 days.

(21) Appl. No.: 13/327,346

(22) Filed: Dec. 15, 2011

(65) Prior Publication Data

US 2012/0147343 A1 Jun. 14, 2012

Related U.S. Application Data

(63) Continuation of application No. PCT/JP2010/059644, filed on Jun. 8, 2010.

(30) Foreign Application Priority Data

Jun. 16, 2009 (JP) ................................. 2009-142943

(51) Int. Cl.

| | |
|---|---|
| *G01B 11/00* | (2006.01) |
| *G03B 27/02* | (2006.01) |
| *G03F 9/00* | (2006.01) |
| *G03F 7/00* | (2006.01) |
| *G03F 7/20* | (2006.01) |

(52) U.S. Cl.  
CPC ............... *G03F 9/7038* (2013.01); *G03F 9/00* (2013.01); *G03F 7/0007* (2013.01); *G03F 7/7035* (2013.01)  
USPC ................................ 355/78; 356/399; 430/22

(58) Field of Classification Search  
CPC ... G03F 7/0007; G03F 7/7035; G03F 7/7038; G03F 9/00; H01L 21/027; H01L 21/68  
USPC ............................ 355/53, 67, 68, 72, 77, 78; 356/399–401; 430/22  
See application file for complete search history.

(56) References Cited

U.S. PATENT DOCUMENTS

2009/0252422 A1* 10/2009 Ogata et al. .................... 382/209  
2012/0170011 A1* 7/2012 Iwamoto ......................... 355/53

FOREIGN PATENT DOCUMENTS

| | | |
|---|---|---|
| JP | 4-76555 | 3/1992 |
| JP | 2006-17895 | 1/2006 |

(Continued)

OTHER PUBLICATIONS

International Search Report from Japanese Patent Office for PCT/JP2010/059644, date of mailing Sep. 14, 2010.

*Primary Examiner* — Toan Ton  
*Assistant Examiner* — Colin Kreutzer  
(74) *Attorney, Agent, or Firm* — Finnegan, Henderson, Farabow, Garrett & Dunner, LLP (57) ABSTRACT

In the present invention, a number of times the brightness changes detected at the same position while a substrate conveys are added up in the conveying direction, thereby obtaining a plurality of edge count data, and then, a plurality of positions of long sides of patterns parallel to the conveying direction is identified based on the plurality of edge count data exceeding a predetermined threshold value, middle point positions of a plurality of proximity pairs are calculated, and a middle point position close to the target position preset in the imaging device is selected from the plurality of middle point positions of the proximity pairs, an amount of position displacement between the selected middle point position and the target position of imaging device is calculated, and the photomask in the direction substantially perpendicular to the conveying direction so that the amount of position displacement is a predetermined value.

8 Claims, 7 Drawing Sheets

(56) References Cited

FOREIGN PATENT DOCUMENTS

| JP | 2006-71440 | 3/2006 |
| JP | 2006-330622 | 12/2006 |
| JP | 2007-41447 | 2/2007 |
| JP | 2008-76709 | 4/2008 |
| JP | 2009-54732 | 3/2009 |
| JP | 2009-75142 | 4/2009 |
| JP | 2010-54849 | 3/2010 |
| JP | 2010-92021 | 4/2010 |
| WO | PCT/JP2010/059644 | 1/2012 |

* cited by examiner

ALIGNMENT METHOD, ALIGNMENT APPARATUS, AND EXPOSURE APPARATUS

This application is a continuation of PCT/JP2010/059644, filed on Jun. 8, 2010.

BACKGROUND OF THE INVENTION

1. Field of the Invention

The present invention relates to an alignment method for aligning a photomask with an object to be exposed having a pattern arranged in a matrix with a long side in at least a portion thereof and conveyed in a direction of the long side, and more particularly to an alignment method, an alignment apparatus, and an exposure apparatus capable of performing highly accurate alignment for a pattern having a complex shape.

2. Description of Related Art

In this type of conventional alignment method, an imaging device having a plurality of light-receiving elements arranged in a straight line in a direction orthogonal to a conveying direction of a color filter substrate, captures an image of a plurality of rectangular pixels formed on a color filter substrate (object to be exposed), detects the position of a left side edge portion of a left-end pixel of the color filter substrate based on brightness information of the captured image, calculates the amount of position displacement between the position of the left side edge portion of the left-end pixel and a reference position (target position) preset in the imaging device, and move a photomask in the direction orthogonal to the conveying direction of the color filter substrate so as to correct the amount of position displacement to thereby perform an alignment between the photomask and the color filter substrate (for example, see Japanese Laid-Open Patent Publication No. 2008-76709).

In the conventional alignment method, however, a position at which brightness changes from dark level to bright level is detected, and based on the detected position, the pattern of the object to be exposed and the openings of the photomask are aligned. Therefore, in the conventional alignment method, for a pattern having a simple rectangular shape, it is easy to detect a reference position set on the edge portion of the pattern and to further perform the alignment, however, for a pattern having a complex shape such as a wiring patterns within pixels, for example, a TFT substrate, it is difficult to detect a reference position set on the edge portion of the pattern of complex shape, and to further perform the alignment. Therefore, it is difficult to perform the alignment between the pattern of the object to be exposed and the openings of the photomask with high accuracy.

SUMMARY OF THE INVENTION

Accordingly, in view of the above problem, it is an object of the present invention to provide an alignment method, an alignment apparatus, and an exposure apparatus capable of performing highly accurate alignment of a photomask for a pattern of a complex shape.

In order to achieve the above object, an alignment method according to the present invention is a method for aligning a photomask with an object to be exposed having a pattern in a matrix with a long side in at least a portion thereof and conveyed in a direction of the long side, and the alignment method includes the steps of: successively processing a plurality of images captured at regular time intervals by a imaging device having a plurality of light-receiving elements arranged in a straight line in a direction perpendicular to a conveying direction of the object to be exposed, thereby detecting a position at which brightness changes in an arrangement direction of the light-receiving elements; adding up, in the conveying direction of the object to be exposed, the number of times the brightness changes detected at the same position in the arrangement direction of the light-receiving elements while the object to be exposed moves by a certain distance, thereby obtaining a plurality of edge count data; identifying a plurality of positions of long sides of the patterns parallel to the conveying direction based on a plurality of edge count data exceeding a predetermined threshold value in the plurality of edge count data; selecting a position of a long side close to a target position preset in the imaging device from the identified positions of long sides; calculating an amount of position displacement between the selected position of the long side and the target position of the imaging device; and relatively moving at least the photomask in the direction perpendicular to the conveying direction of the object to be exposed so that the amount of position displacement is a predetermined value, thereby performing alignment between the photomask and the object to be exposed.

According to this configuration, the plurality of images captured at the regular time intervals by the imaging device having the plurality of light-receiving elements arranged in the straight line in the direction perpendicular to the direction of the object to be exposed are successively processed while conveying the object to be exposed having the pattern in the matrix with the long side in at least a portion thereof, thereby detecting a position at which brightness changes in the arrangement direction of the light-receiving elements, and the number of times the brightness changes detected at the same position in the arrangement direction of the light-receiving elements while the object to be exposed moves by the certain distance are added up in the conveying direction of the object to be exposed, thereby obtaining a plurality of edge count data, and then, the plurality of positions of long sides of the patterns parallel to the conveying direction are identified based on the plurality of edge count data exceeding the predetermined threshold value in the plurality of edge count data, and the position of the long side of the pattern close to the target position preset in the imaging device is selected from the identified positions of long sides, and then, the amount of position displacement between the selected position of the long side and the target position of the imaging device is calculated, and at least the photomask is relatively moved in the direction perpendicular to the conveying direction of the object to be exposed so as to correct the amount of position displacement, thereby performing the alignment between the photomask and the object to be exposed.

Preferably, after the plurality of positions of long sides are identified, instead of executing the step of selecting the position of the long side close to the target position preset in the imaging device, the steps of calculating middle point positions of a plurality of proximity pairs in the plurality of long sides and selecting a middle point position close to the target position preset in the imaging device from the plurality of middle point positions of the proximity pairs are executed, and in the step of calculating the amount of position displacement, an amount of position displacement between the selected middle point position and the target position of the imaging device is calculated.

Furthermore, preferably, the imaging device captures an image of the pattern of the object to be exposed using transillumination.

Preferably, the object to be exposed is a TFT substrate on which a wiring pattern is formed.

An alignment apparatus according to the present invention aligns a photomask with an object to be exposed having a pattern in a matrix with a long side in at least a portion thereof and conveyed in a direction of the long side, and the alignment apparatus includes an image processing section for successively processing a plurality of images captured at regular time intervals by imaging device having a plurality of light-receiving elements arranged in a straight line in a direction perpendicular to a conveying direction of the object to be exposed, thereby detecting a position at which brightness changes in an arrangement direction of the light-receiving elements, adding up, in the conveying direction of the object to be exposed, the number of times the brightness changes detected at the same position in the arrangement direction of the light-receiving elements while the object to be exposed moves by a certain distance, thereby obtaining a plurality of edge count data, and identifying a plurality of positions of long sides of the patterns parallel to the conveying direction based on a plurality of edge count data exceeding a predetermined threshold value in the plurality of edge count data. The alignment apparatus further includes: an arithmetic section for selecting a position of a long side close to a target position preset in the imaging device from the identified positions of long sides, and for calculating an amount of position displacement between the selected position of the long side and the target position of the imaging device; and an alignment mechanism for relatively moving at least the photomask in the direction perpendicular to the conveying direction of the object to be exposed so that the amount of position displacement is a predetermined value, thereby performing alignment between the photomask and the object to be exposed.

According to this configuration, the image processing section successively processes a plurality of images captured at regular time intervals by the imaging device having the plurality of light-receiving elements arranged in the straight line in the direction perpendicular to the conveying direction of the object to be exposed that has the pattern in the matrix with the long side in at least a portion thereof and is conveyed in the direction of the long side, thereby detecting a position at which brightness changes in the arrangement direction of the light-receiving elements, and the number of times the brightness changes detected at the same position in the arrangement direction of the light-receiving elements while the object to be exposed moves by a certain distance are added up in the conveying direction in which the object to be exposed, thereby obtaining a plurality of edge count data. Then, a plurality of positions of long sides of the patterns in parallel to the conveying direction are identified based on a plurality of edge count data exceeding a predetermined threshold value in the plurality of edge count data, and a position of a long side close to a target position preset in the imaging device is selected from the identified positions of long sides, and calculates an amount of position displacement between the selected position of the long side and the target position of the imaging device. The alignment mechanism relatively moves at least the photomask in the direction perpendicular to the conveying direction of the object to be exposed so that the amount of position displacement is a predetermined value, thereby performing alignment between the photomask and the object to be exposed, thereby aligning the photomask and the object to be exposed.

Preferably, the arithmetic section calculates middle point positions of a plurality of proximity pairs in the plurality of identified long sides, selects a middle point position close to the target position preset in the imaging device from the plurality of middle point positions of the proximity pairs, and calculates an amount of position displacement between the selected middle point position and the target position of the imaging device.

An exposure apparatus according to the present invention performs exposure process upon aligning a photomask with an object to be exposed having a pattern in a matrix having a long side in at least a portion thereof and conveyed in a direction of the long side, and the exposure apparatus includes: a light source for emitting an ultraviolet light; a mask stage which holds the photomask in such a manner that the photomask closely faces a surface of the object to be exposed that is being conveyed; imaging device which has a plurality of light-receiving elements arranged in a straight line in a direction perpendicular to a conveying direction of the object to be exposed and which captures an image of the object at a position spaced apart a certain distance in a direction opposite to the conveying direction of an exposure position with the photomask; and an alignment apparatus which successively processes a plurality of images captured at regular time intervals by imaging device, thereby detecting a position at which brightness changes in an arrangement direction of the light-receiving elements of the imaging device, adds up, in the conveying direction of the object to be exposed, the number of times the brightness changes detected at the same position in the arrangement direction of the light-receiving elements while the object to be exposed moves by a certain distance, thereby obtaining a plurality of edge count data, identifies a plurality of positions of long sides of the patterns in parallel to the conveying direction based on a plurality of edge count data exceeding a predetermined threshold value in the plurality of edge count data, selects a position of a long side close to a target position preset in the imaging device from the identified positions of long sides, and calculates an amount of position displacement between the selected position of the long side and the target position of the imaging device, and relatively moves at least the mask stage in the direction perpendicular to the conveying direction in which the object to be exposed so that the amount of position displacement is a predetermined value, thereby performing alignment between the photomask and the object to be exposed.

According to this configuration, the alignment apparatus successively processes a plurality of images captured at a regular time intervals by the imaging device having the plurality of light-receiving elements arranged in the straight line in the direction perpendicular to the conveying direction of the object to be exposed while conveying the object to be exposed having the pattern in the matrix with the long side in at least a portion thereof, thereby detecting a position at which brightness changes in an arrangement direction of the light-receiving elements, and the number of times the brightness changes detected at the same position in the arrangement direction of the light-receiving elements while the object to be exposed moves by a certain distance are added up in the conveying direction of the object to be exposed, thereby obtaining a plurality of edge count data. Then, a plurality of positions of long sides of the patterns in parallel to the conveying direction are identified based on a plurality of edge count data exceeding a predetermined threshold value in the plurality of edge count data, and a position of a long side close to a target position preset in the imaging device is selected from the identified positions of long sides. Then, an amount of position displacement between the selected position of the long side and the target position of the imaging device is calculated, and at least the mask stage for holding the photomask in such a manner that the photomask closely faces the surface of the object to be exposed that is being conveyed is relatively moved in the direction perpendicular to the conveying direction of the object to be exposed so that the amount of position displacement is a predetermined value, thereby performing alignment the photomask and the object to be exposed. Then, the light source emits the ultraviolet ray to expose the object to be exposed.

Preferably, after the plurality of positions of long sides are identified, the alignment apparatus calculates middle point positions of a plurality of proximity pairs in the plurality of long sides, selects a middle point position close to the target position preset in the imaging device from the plurality of middle point positions of the proximity pairs, and calculates an amount of position displacement between the selected middle point position and the target position of the imaging device.

According to the invention of a first or fifth aspect, even in the case in which the patterns formed on the object to be exposed each have a complex shape, it is possible to easily detect the long side portion of the pattern on the object to be exposed in parallel to the conveying direction by successively processing the captured images of the object to be exposed being conveyed. Therefore, it is possible to cause the photomask to follow the movement of the object to be exposed conveyed while being swayed in the direction perpendicular to the conveying direction with reference to the detected long side portion, thereby, enabling the openings of the photomask to be accurately aligned with the pattern of the object to be exposed. Accordingly, the accuracy in aligning the openings of the photomask with the pattern on the object to be exposed can be enhanced.

According to the invention of a second, sixth or eighth aspect, the middle point positions of the identified proximity pairs of the long sides can be detected and the alignment between the object to be exposed and the photomask can be performed. Therefore, when both of the brightness changes from dark level to bright level and the brightness changes from bright level to dark level are detected, the target position of the position alignment close to the target position set in the imaging device can be easily selected.

According to the invention of a third aspect, the contrast in the images captured by the imaging device can be enhanced, and this makes it easy to detect the long side portion of the pattern on the object to be exposed in parallel to the conveying direction. Therefore, the object to be exposed and the photomask can be aligned accurately.

Furthermore, according to the invention of a fourth aspect, the openings of the photomask can be accurately aligned even with a TFT substrate having a wiring pattern within the pixel.

Furthermore, according to the invention of a seventh aspect, even in the case in which the patterns formed on the object to be exposed each have a complex shape, it is possible to easily detect a long side portion of the pattern on the object to be exposed in parallel to the conveying direction by successively processing the captured images of the object to be exposed being conveyed. Therefore, it is possible to cause the photomask to follow the movement of the object to be exposed that is conveyed while being swayed in the direction perpendicular to the conveying direction with reference to the detected long side portion, thereby enabling the openings of the photomask to be accurately aligned with the pattern of the object to be exposed.

BRIEF DESCRIPTION OF THE DRAWINGS

FIGS. 7A to 7C are explanatory diagrams illustrating the alignment method according to the present invention.

DESCRIPTION OF THE PREFERRED EMBODIMENTS

Figure 1:
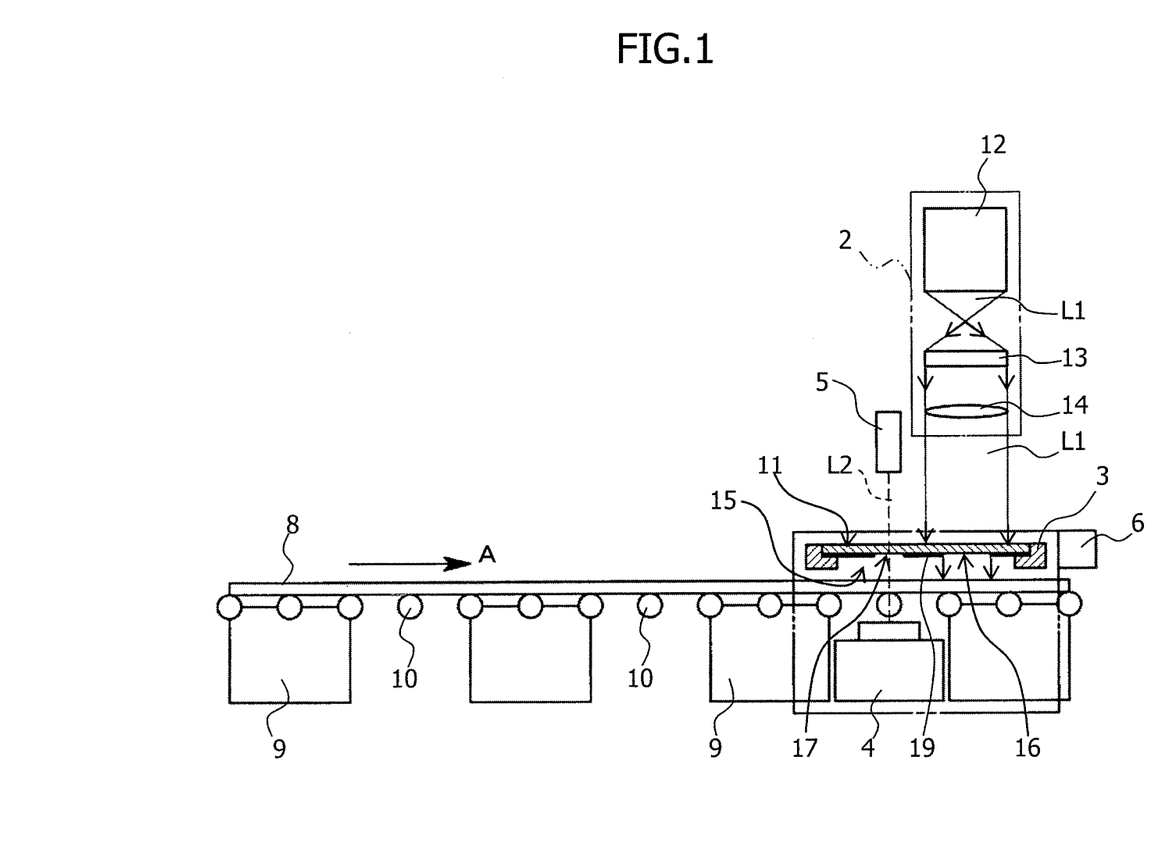
FIG. 1 is a front view illustrating an embodiment of an exposure apparatus according to the present invention.

An embodiment of the present invention will be hereinafter explained in detail with reference to appended drawings. FIG. 1 is a front view illustrating an embodiment of an exposure apparatus according to the present invention. This exposure apparatus aligns a photomask with an object to be exposed having a pattern in a matrix with a long side in at least a portion thereof and conveyed in a direction of the long side and exposes the object. The exposure apparatus includes a conveying device 1, an exposure optical system 2, a mask stage 3, imaging device 4, an illumination light source 5, and an alignment apparatus 6.

Figure 2:
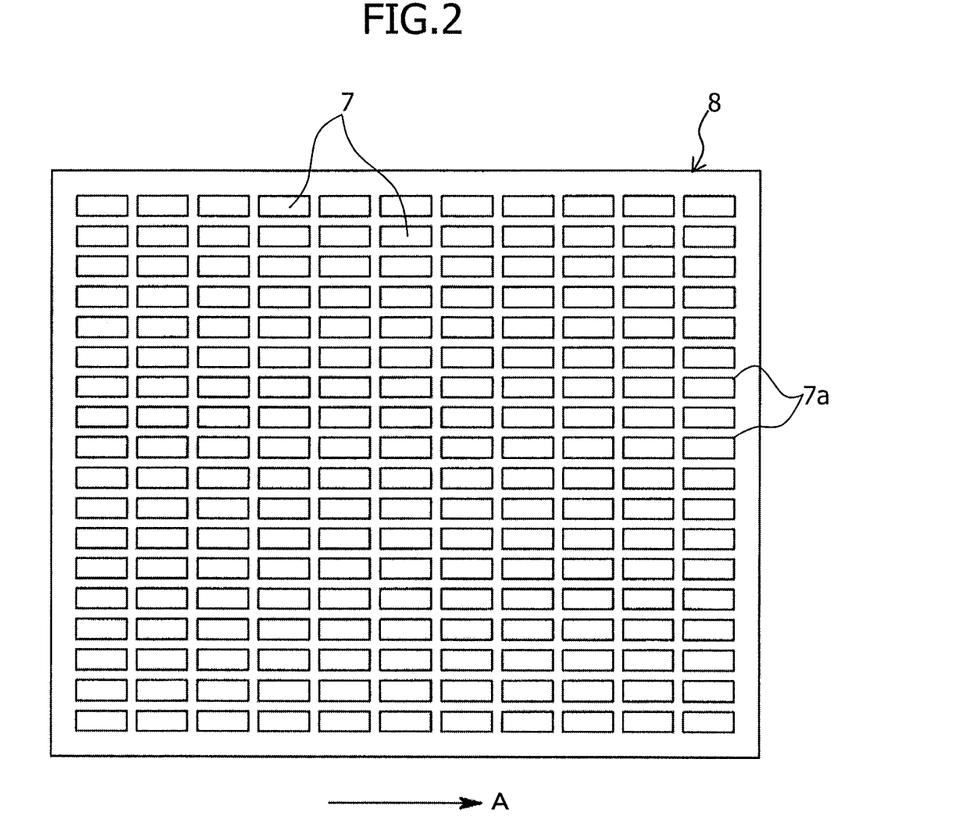
FIG. 2 is a top view illustrating a color filter substrate used in the above embodiment.

In this case, the object to be exposed is a color filter substrate 8 in which rectangular pixels 7 (pattern) are formed in a matrix as shown in FIG. 2, for example. In this explanation, the color filter substrate 8 is conveyed in a direction of arrow A as shown in FIG. 2.

The color filter substrate 8 is placed on the upper surface of the conveying device 1, and the conveying device 1 conveys the color filter substrate 8 in a direction of arrow A in FIG. 1. In the conveying device 1, a plurality of unit stages 9, each having a plurality of ejection holes for ejecting gas and a plurality of suction holes for sucking gas provided on the upper surface thereof, are arranged in parallel in the conveying direction in which the color filter substrate 8 is conveyed (hereinafter referred to as "substrate conveying direction"), and in a state in which the color filter substrate 8 is spaced a given amount from and over the plurality of unit stages 9 with a balance maintained between the ejection and suction of the gas, the color filter substrate 8 is conveyed with the edge portions at both ends of the color filter substrate 8 being supported by conveying rollers 10.

Above the conveying device 1, the exposure optical system 2 is provided. The exposure optical system 2 irradiates a photomask 11 described later with a uniform light source light L1. The exposure optical system 2 includes an exposure light source 12, a photo-integrator 13, and a condenser lens 14, which are arranged in this order from the upstream to the downstream of the optical path.

In this case, the exposure light source 12 emits ultraviolet light. For example, the exposure light source 12 is a laser oscillator or a xenon flash lamp. The photo-integrator 13 provides uniform brightness distribution within the cross section of the light source light L1 emitted from the exposure light source 12. For example, the photo-integrator 13 is a fly eye lens, a rod lens, or a light pipe. The condenser lens 14 makes the light source light L1 into parallel light, and irradiates the photomask 11 with the parallel light.

The mask stage 3 is provided between the conveying device 1 and the exposure optical system 2. The mask stage 3 is parallel to a surface of the color filter substrate 8 being conveyed, and holds the photomask 11 so as to be opposite to and close to the surface of the color filter substrate 8. In the center of the mask stage 3, an opening 15 is formed to hold edge portions of the photomask 11.

Figure 3:
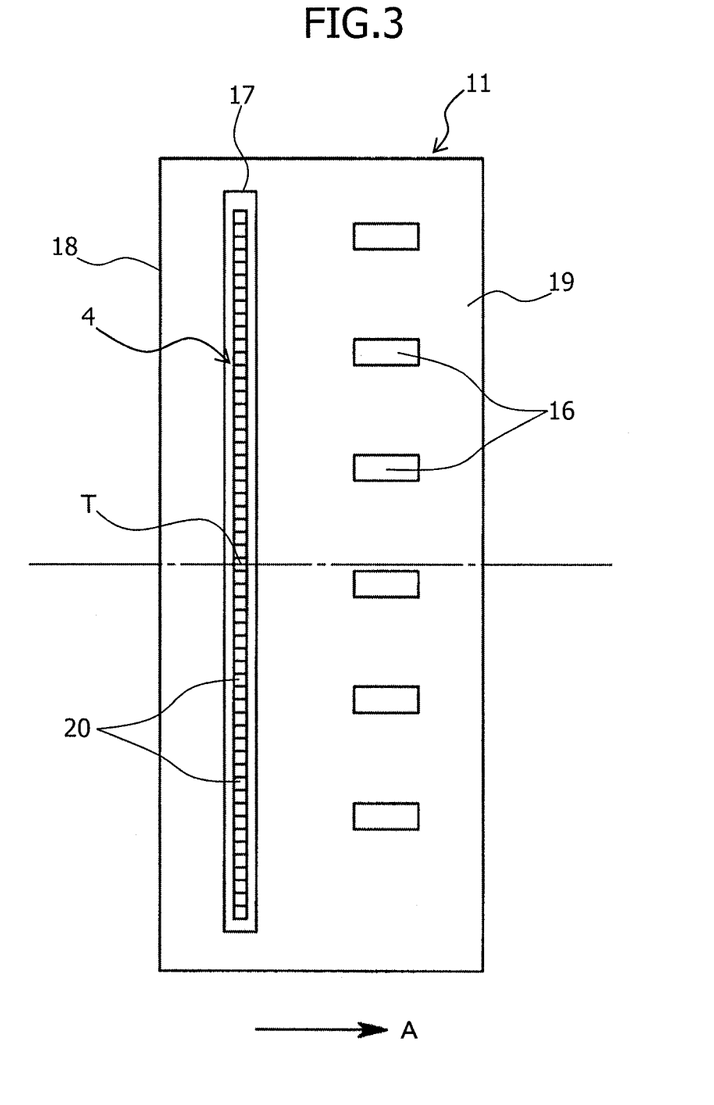
FIG. 3 is a top view illustrating a photomask used in the above embodiment, and is an explanatory diagram illustrating a positional relationship between mask patterns and an imaging device.

As shown in FIG. 3, the photomask 11 is formed by arranging a plurality of openings (hereinafter referred to as "mask patterns 16"), each of which has substantially the same shape as the pixel 7, so as to have a given positional relationship with the center line parallel to the arrow A (the substrate conveying direction), the plurality of openings are arranged with a pitch three times as large as an arrangement pitch of the pixels 7 in a direction perpendicular (orthogonal) to the arrow A in FIG. 2. At a side of the row of the mask pattern 16, a narrow and long illumination window 17 for passing illumination light L2 of the illumination light source 5, described later, is formed with a certain distance spaced apart from and in parallel to the row of the mask pattern 16. Then, as shown in FIG. 3, the row side of the mask pattern 16 is held by the mask stage 3 in such a manner that the row side of the mask pattern 16 is at the front side in the substrate conveying direction indicated by the arrow A. In the present embodiment, the width of the mask pattern 16 in a direction perpendicular to the substrate conveying direction (direction of arrow A) is formed to have the same size as the arrangement pitch of the pixel 7 in the same direction.

More specifically, the photomask 11 is made by forming a light shielding film 19 of chrome (Cr) over a surface of a transparent glass substrate 18, and then forming the mask pattern 16 and the illumination window 17 on the light shielding film 19. On the other side of the glass substrate 18, an anti-reflection film is formed so as to correspond to the row of the mask pattern 16, and a filter film is formed to transmit visible light but reflect or absorb ultraviolet light so as to the illumination window 17. As shown in FIG. 1, the photomask 11 is held on the mask stage 3 with the surface on which the light shielding film 19 is formed facing downward.

The imaging device 4 is provided at the side of the conveying device 1 so as to face the mask stage 3. The imaging device 4 provided at a position spaced apart a certain distance in a direction opposite to the substrate conveying direction from an exposure position with the photomask 11 captures an image of the plurality of pixels 7 formed on the color filter substrate 8. As shown in FIG. 3, the imaging device 4 is a line CCD (sensor) having a plurality of light-receiving elements 20 arranged in a straight line in a direction perpendicular to the substrate conveying direction (direction of arrow A). A target position T serving as a target of alignment between the color filter substrate 8 and the photomask 11 is predetermined at a preset position of the linear light receiving section (in FIG. 3, center position of longitudinal axis). In the present embodiment, the imaging device 4 is arranged so that the target position T thereof matches the center line of the photomask 11 parallel to the substrate conveying direction indicated by the arrow A as shown in FIG. 3.

Above the mask stage 3, the illumination light source 5 is provided to face the imaging device 4. The illumination light source 5 irradiates the color filter substrate 8 with the illumination light L2 through the illumination window 17 of the photomask 11, so that the imaging device 4 can capture an image of the pixels 7 of the color filter substrate 8 using the light transmitted through the color filter substrate 8. For example, the illumination light source 5 is a halogen lamp mainly emitting visible light.

Figure 4:
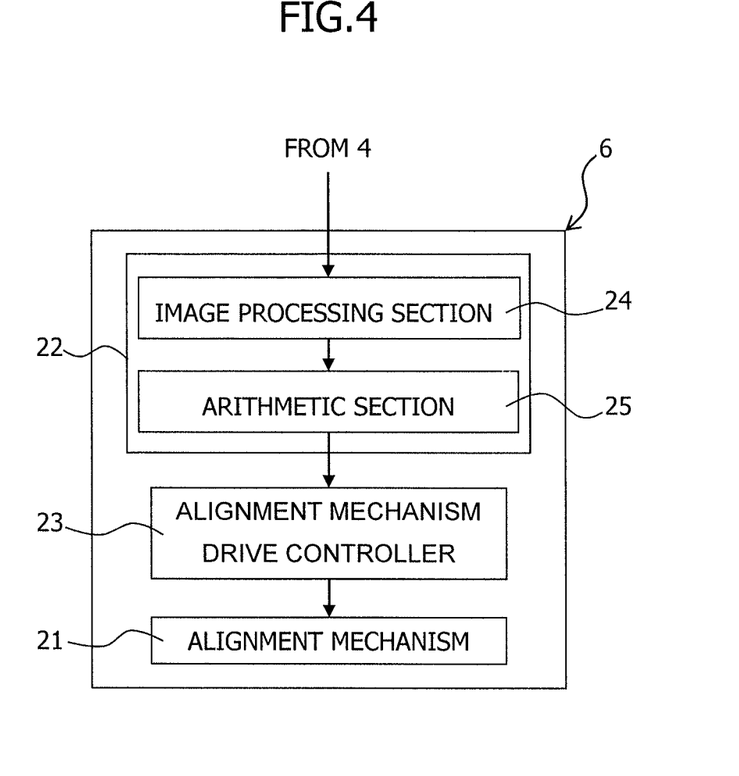
FIG. 4 is a block diagram illustrating an embodiment of an alignment apparatus according to the present invention.

The alignment apparatus 6 is provided such that the mask stage 3 and the imaging device 4 are integrally movable in the direction perpendicular to the substrate conveying direction within the plane parallel to the surface of the color filter substrate 8. The alignment apparatus 6 aligns the photomask 11 with the color filter substrate 8 as follows: a plurality of images captured by the imaging device 4 at predetermined time intervals are successively processed, and a position at which brightness changes in an arrangement direction of the light-receiving elements 20 of the imaging device 4 is detected; a plurality of edge count data are obtained by adding up, in the substrate conveying direction, the number of times the brightness changes detected at the same position in the arrangement direction of the light-receiving elements 20 while the color filter substrate 8 moves by a certain distance; a plurality of positions of long sides of the pixels 7 on the color filter substrate 8 parallel to the substrate conveying direction are identified based on a plurality of edge count data exceeding a predetermined threshold value in the plurality of edge count data; and middle point positions of a plurality of proximity pairs are calculated in the plurality of long sides; a middle point position close to the preset target position T in the imaging device 4 is selected from the plurality of middle point positions; the amount of position displacement between the selected middle point position and the target position T of the imaging device 4 is calculated; and accordingly, the photomask 11 is moved in the direction perpendicular to the substrate conveying direction so that the amount of position displacement is a predetermined value. As shown in FIG. 4, the alignment apparatus 6 includes an alignment mechanism 21, a position displacement amount detection section 22, and an alignment mechanism drive controller 23. In the present embodiment, the width of the mask pattern 16 of the photomask 11 in a direction perpendicular to the substrate conveying direction is formed to have the same size as the arrangement pitch of the pixel 7 in the same direction. As a result of the above alignments, the edge portions at both ends of the mask pattern 16 parallel to the substrate conveying direction (direction of arrow A) are located in the intermediate position between the adjacent pixels 7 to each other.

Here, the alignment mechanism 21 integrally moves the mask stage 3 and the imaging device 4 in the direction perpendicular to the substrate conveying direction within the surface parallel to the surface of the color filter substrate 8. For example, the alignment mechanism 21 includes a motor and a slide stage. The position displacement amount detection section 22 processes the image captured by the imaging device 4 and calculates the amount of position displacement between the photomask 11 and the color filter substrate 8. As shown in FIG. 4, the position displacement amount detection section 22 includes an image processing section 24 and an arithmetic section 25 constituted by a CPU. In this case, the image processing section 24 has a function of successively processing a plurality of images captured by the imaging device 4 at regular time intervals, by detecting a position at which brightness changes in an arrangement direction of the light-receiving elements 20 of the imaging device 4, obtaining a plurality of edge count data by adding up, in the substrate conveying direction, the number of times the brightness changes detected at the same position in the arrangement direction of the light-receiving elements 20 while the color filter substrate 8 moves by a certain distance (the data is not the number of added edges obtained while imaging device 4 imports one line of data), and identifying a plurality of positions of long sides of the pixels 7 on the color filter substrate 8 parallel to the substrate conveying direction based on the plurality of edge count data exceeding the predetermined threshold value in the plurality of edge count data. The arithmetic section 25 has a function of calculating middle point positions of a plurality of proximity pairs in the plurality of long sides identified by the image processing section 24, selecting a middle point position close to the preset target position T in the imaging device 4 from the plurality of middle point positions, and calculating the amount of position displacement between the selected middle point position and the target position T of the imaging device 4. The arithmetic section 25 executes arithmetic processing with software. Then, the alignment mechanism drive controller 23 controls the drive of the motor of the alignment mechanism 21 to integrally move the mask stage 3 and the imaging device 4 so that the amount of position displacement calculated by the arithmetic section 25 is a predetermined value.

The following describes the operation of the exposure apparatus having the above-mentioned configuration.

First, the color filter substrate 8 coated with a predetermined color resist is aligned with a position on the conveying device 1 and placed thereon, and is conveyed at a constant speed in the direction of arrow A as shown in FIG. 1.

When the front side of the color filter substrate 8 in the substrate conveying direction reaches a position above the imaging device 4, the imaging device 4 starts capturing an image. At this occasion, the color filter substrate 8 is irradiated with the illumination light L2 of the illumination light source 5 through the illumination window 17 of the photomask 11, and the illumination light L2 having passed through the pixels 7 of the color filter substrate 8 is received by the imaging device 4. As a result, the imaging device 4 captures a one-dimensional image of the plurality of pixels 7 formed on the color filter substrate 8 in the direction perpendicular to the substrate conveying direction (arrow A). This image capturing process of the imaging device 4 is performed every time the color filter substrate 8 moves by a distance substantially equal to the width of the light-receiving element 20 in the substrate conveying direction (direction of arrow A as shown in FIG. 3).

The image processing section 24 successively processes the images captured by the imaging device 4 at the regular time intervals, so that two-dimensional image data is generated. The generated two-dimensional image data is compared with a look-up table saved in a memory, not shown, and for example, corner portions 7*a* of the pixels 7 as shown in FIG. 2 at the front side in the substrate conveying direction of the color filter substrate 8 are detected. Then, the color filter substrate 8 moves by a certain distance after the corner portions 7*a* of the pixels 7 are detected, and when the pixels 7 reach the lower side of the row of the mask pattern 16 of the photomask 11, the exposure light source 12 lights for only a certain period of time, so that the image of the mask pattern 16 of the photomask 11 is transferred onto the color resists on the pixels 7 by the exposure process. It should be noted that the distance the color filter substrate 8 has moved is detected by a position sensor provided on the conveying device 1.

Figure 5:
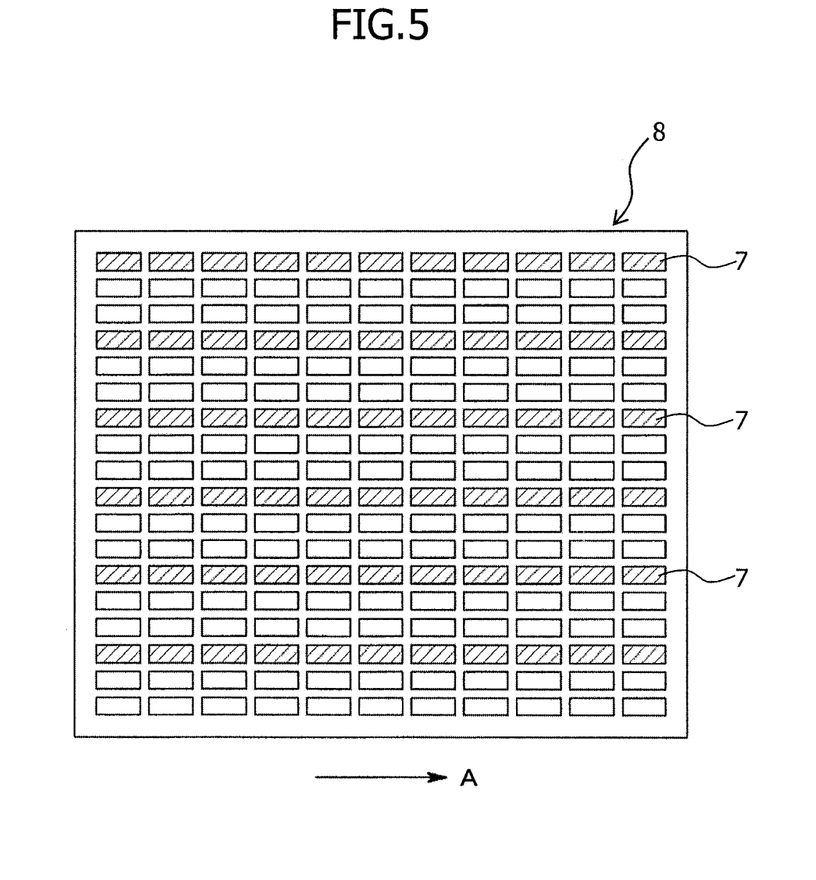
FIG. 5 is an explanatory diagram illustrating an example of exposure onto the color filter substrate.

Thereafter, every time the color filter substrate 8 moves by the distance equal to the arrangement pitch of the pixels 7 in the substrate conveying direction, the exposure light source 12 lights for only a certain period of time, thus performing the exposure process. This enables the color resists having corresponding colors to be formed by the exposure process on the target pixels 7 of the color filter substrate 8 as shown by shaded areas in FIG. 5.

In this case, the alignment between the photomask 11 and the color filter substrate 8 is performed while the color filter substrate 8 is conveyed between the image capturing position by the imaging device 4 and the exposure position with the photomask 11.

Figure 6:
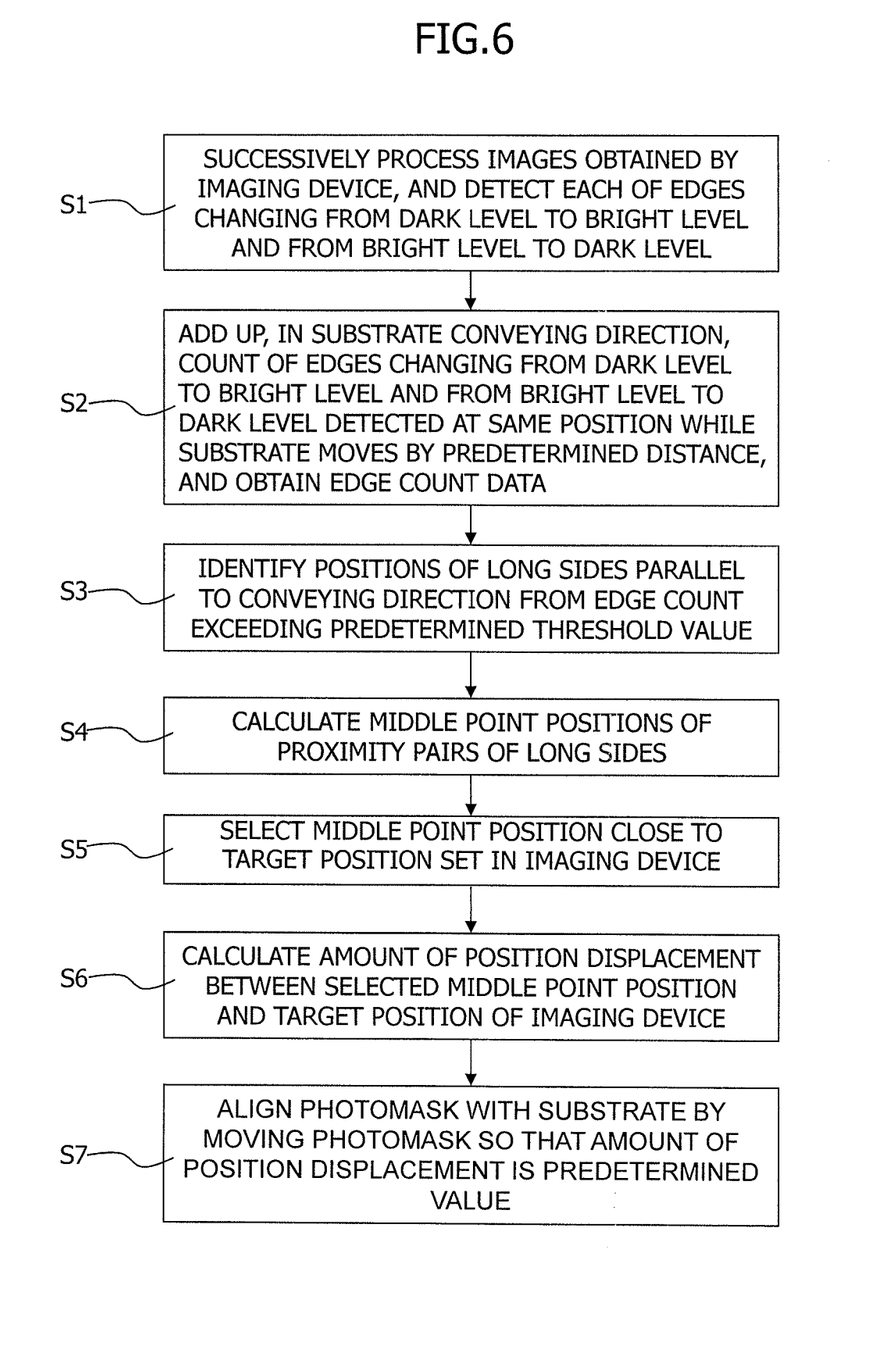
FIG. 6 is a flowchart illustrating an alignment method according to the present invention.

Hereinafter, an alignment method according to the present invention will be described with reference to a flowchart in FIG. 6.

Figure 7A:
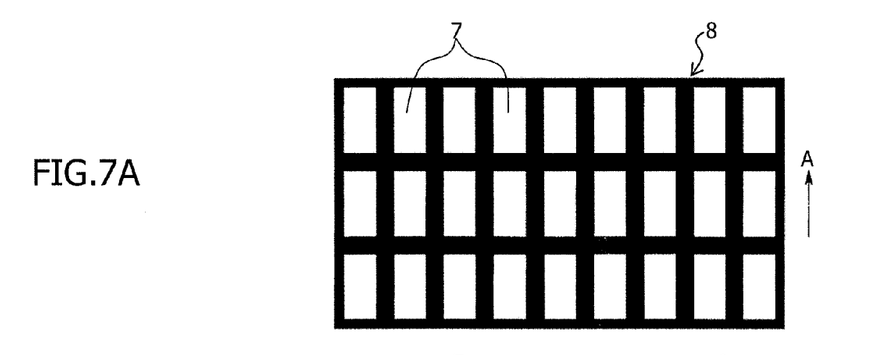
FIG. 7A illustrates the color filter substrate.
Figure 7B:
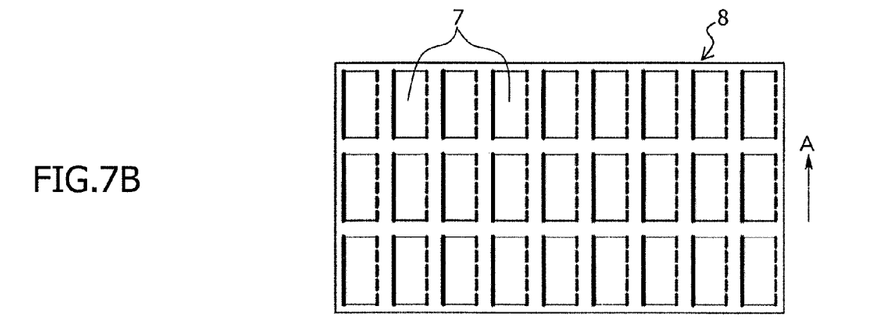
FIG. 7B illustrates a detection result of edge portions of pixels on the color filter substrate in parallel to a conveying direction.

First, in step S1, the images input from the imaging device 4 at regular time intervals are successively processed by the image processing section 24, and each of a plurality of edges of the pixels 7 on the color filter substrate 8 (see FIG. 7A) at which brightness changes from dark level to bright level (see thick solid line in FIG. 7A) and a plurality of edges thereof at which brightness changes from bright level to dark level (see thick broken lines of FIG. 7B) is detected.

Figure 7C:
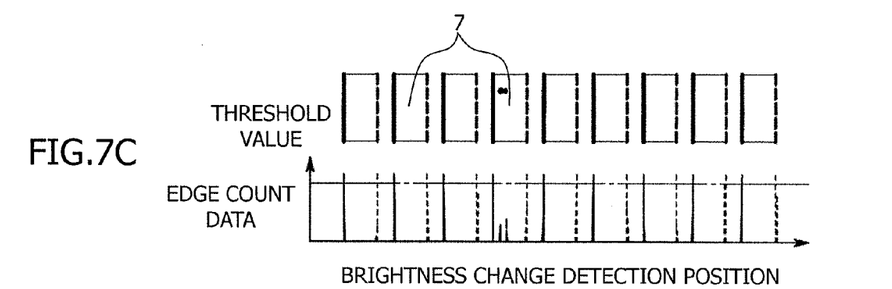
FIG. 7C illustrates edge count data corresponding to an upper pixel row.

In step S2, the count of the plurality of edges at which brightness changes from dark level to bright level and the plurality of edges at which brightness changes from bright level to dark level which are detected at the same position in the direction in which the light-receiving elements 20 of the imaging device 4 are arranged while the color filter substrate 8 moves by the distance equal to the arrangement pitch of the pixels 7 in the substrate conveying direction, are added up in the substrate conveying direction, so that a plurality of edge count data are obtained (see FIG. 7C).

In step S3, the plurality of edge count data are compared with the predetermined threshold value, and a plurality of edges (long sides) of the pixels 7 parallel to the substrate conveying direction on the color filter substrate 8 are identified on the basis of the plurality of edge count data exceeding the threshold value.

In step S4, middle point positions of the plurality of adjacent edge pairs are calculated for the plurality of edges (long sides) identified in step S3.

In step S5, a middle point position close to the target position T set in the imaging device 4 is extracted from the plurality of middle point positions of the adjacent edge pairs calculated in step S4.

In step S6, the amount of position displacement between the middle point position extracted in step S5 and the target position T set in the imaging device 4 is calculated.

In step S7, the alignment mechanism drive controller 23 controls the drive of the motor of the alignment mechanism 21 to move the mask stage 3 integrally with the imaging device 4 in the direction perpendicular to the substrate conveying direction so that the amount of position displacement calculated in step S6 is a predetermined value, e.g., zero, to thereby perform alignment between the mask pattern 16 of the photomask 11 and the pixels 7 of the color filter substrate 8.

Then, the above steps S1 to S7 are continuously executed even while the color filter substrate 8 moves, and the exposure process is performed while the photomask 11 aligned to the color filter substrate 8 being moved. Therefore, even if the color filter substrate 8 is conveyed swaying right and left, the exposure process can be performed with the photomask 11 automatically following the movement of the color filter substrate 8, so that the accuracy in the superimposed exposure process is enhanced.

In the above-described embodiment, there is explained a case in which both of the brightness changes from dark level to bright level and the brightness changes from bright level to dark level are detected, and the positions of the plurality of long sides of the pixels 7 parallel to the substrate conveying direction on the color filter substrate 8 are identified, and thereafter, the middle point positions of the plurality of proximity pairs are calculated for the plurality of long sides, and the middle point position close to the target position T preset in the imaging device 4 is selected from the middle point positions of the plurality of proximity pairs, and then, the position displacement between the selected middle point position and the target position T of the imaging device 4 is calculated. However, the present invention is not limited thereto. Only one of the brightness changes from dark level to bright level and the brightness changes from bright level to dark level may be detected, and the plurality of long sides of the pixels 7 parallel to the substrate conveying direction on the color filter substrate 8 may be identified. Then, a position of a long side close to a the target position T preset in the imaging device 4 may be selected from the positions of the plurality of identified long sides, and the position displacement between the selected position of the long side and the target position T of the imaging device 4 may be calculated.

In the above-described embodiment, there is explained a case in which the alignment apparatus 6 moves the mask stage 3 integrally with the imaging device 4 in the direction perpendicular to the substrate conveying direction. However, the present invention is not limited thereto. Only the mask stage 3 may be moved. In this case, as long as the moving distance of the mask state 3 is enable to be measured by a linear scale and the like, the mask stage 3 may be moved by a distance equal to the amount of the position displacement between the selected position of the long side of the pixel 7 on the color filter substrate 8 and the target position T of the imaging device 4. Alternatively, the alignment apparatus 6 may move the color filter substrate 8 in the direction perpendicular to the substrate conveying direction.

In the above-described embodiment, there is explained a case in which the object to be exposed is the color filter substrate 8 with patterns (pixels 7) each having a relatively simple shape formed on the surface thereof. However, the present invention is not limited thereto. The object to be exposed may be anything as long as the pattern formed on the surface thereof has a long side portion parallel to the substrate conveying direction. For example, the object to be exposed may be a TFT substrate having a complex wiring pattern within the pixel 7. Furthermore, particularly in the object to be exposed with the patterns having the complex shape as described above, the advantages of the present invention can be sufficiently achieved.

In the above-described embodiment, there is explained a case in which illumination is transillumination. However, the present invention is not limited thereto. When each pattern of the object to be exposed is separated by, e.g., a light absorbing film, the illumination may be epi-illumination.

It should be noted that the entire contents of Japanese Patent Application No. 2009-142943, filed on Jun. 16, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An alignment method for aligning a photomask with an object to be exposed having a pattern in a matrix with a long side in at least a portion thereof and conveyed in a direction of the long side, the alignment method comprising the steps of:

successively processing a plurality of images captured at regular time intervals by imaging device having a plurality of light-receiving elements arranged in a straight line in a direction perpendicular to a conveying direction of the object to be exposed, thereby detecting a position at which brightness changes in an arrangement direction of the light-receiving elements;

adding up, in the conveying direction of the object to be exposed, the number of times the brightness changes detected at the same position in the arrangement direction of the light-receiving elements while the object to be exposed moves by a certain distance, thereby obtaining a plurality of edge count data;

identifying a plurality of positions of long sides of the patterns parallel to the conveying direction based on a plurality of edge count data exceeding a predetermined threshold value in the plurality of edge count data;

selecting a position of a long side close to a target position preset in the imaging device from the identified positions of long sides;

calculating an amount of position displacement between the selected position of the long side and the target position of the imaging device; and relatively moving at least the photomask in the direction perpendicular to the conveying direction of the object to be exposed so that the amount of position displacement is a predetermined value, thereby performing alignment between the photomask and the object to be exposed.

2. The alignment method according to claim 1, further comprising the step of: after the plurality of positions of long sides are identified, calculating middle point positions of a plurality of proximity pairs in the plurality of long sides and selecting a middle point position close to the target position preset in the imaging device from the plurality of middle point positions of the proximity pairs, instead of comprising the step of selecting the position of the long side close to the target position preset in the imaging device, wherein in the step of calculating the amount of position displacement, an amount of position displacement between the selected middle point position and the target position of the imaging device is calculated.

3. The alignment method according to claim 1, wherein the imaging device captures an image of the pattern of the object to be exposed using transillumination.

4. The alignment method according to claim 1, wherein the object to be exposed is a TFT substrate on which a wiring pattern is formed.

5. An alignment apparatus for aligning a photomask with an object to be exposed having a pattern in a matrix with a long side in at least a portion thereof and conveyed in a direction of the long side, the alignment apparatus comprising:

an image processing section which successively processes a plurality of images captured at regular time intervals by imaging device having a plurality of light-receiving elements arranged in a straight line in a direction perpendicular to a conveying direction of the object to be exposed, thereby detecting a position at which brightness changes in an arrangement direction of the light-receiving elements, the image processing section which adds up, in the conveying direction of the object to be exposed, the number of times the brightness changes detected at the same position in the arrangement direction of the light-receiving elements while the object to be exposed moves by a certain distance, thereby obtaining a plurality of edge count data, and the image processing section which identifies a plurality of positions of long sides of the patterns parallel to the conveying direction based on a plurality of edge count data exceeding a predetermined threshold value in the plurality of edge count data;

an arithmetic section which selects a position of a long side close to a target position preset in the imaging device from the identified positions of long sides, and calculates an amount of position displacement between the selected position of the long side and the target position of the imaging device; and an alignment mechanism which relatively moves at least the photomask in the direction perpendicular to the conveying direction of the object to be exposed so that the amount of position displacement is a predetermined value, thereby performing alignment between the photomask and the object to be exposed.

6. The alignment apparatus according to claim 5, wherein the arithmetic section calculates middle point positions of a plurality of proximity pairs in the plurality of identified long sides, selects a middle point position close to the target position preset in the imaging device from the plurality of middle point positions of the proximity pairs, and calculates an amount of position displacement between the selected middle point position and the target position of the imaging device.

7. An exposure apparatus for performing exposure process upon aligning a photomask with an object to be exposed having a pattern in a matrix with a long side in at least a portion thereof and conveyed in a direction of the long side, the exposure apparatus comprising:

a light source which emits an ultraviolet light;

a mask stage which holds the photomask so as to be opposite to and close to a surface of the object to be exposed that is being conveyed;

an imaging device which has a plurality of light-receiving elements arranged in a straight line in a direction perpendicular to a conveying direction of the object to be exposed, and captures an image of the object at a position spaced apart a certain distance in a direction opposite to the conveying direction of an exposure position with the photomask; and an alignment apparatus which successively processes a plurality of images captured at regular time intervals by the imaging device, thereby detecting a position at which brightness changes in an arrangement direction of the light-receiving elements of the imaging device, adds up, in the conveying direction of the object to be exposed, the number of times the brightness changes detected at the same position in the arrangement direction of the light-receiving elements while the object to be exposed moves by a certain distance, thereby obtaining a plurality of edge count data, identifies a plurality of positions of long sides of the patterns parallel to the conveying direction based on a plurality of edge count data exceeding a predetermined threshold value in the plurality of edge count data, selects a position of a long side close to a target position preset in the imaging device from the identified positions of long sides, calculates an amount of position displacement between the selected position of the long side and the target position of the imaging device, and relatively moves at least the mask stage in the direction perpendicular to the conveying direction of the object to be exposed so that the amount of position displacement is a predetermined value, thereby performing alignment between the photomask and the object to be exposed.

8. The exposure apparatus according to claim 7, wherein after the plurality of positions of long sides are identified, the alignment apparatus calculates middle point positions of a plurality of proximity pairs in the plurality of long sides, selects a middle point position close to the target position preset in the imaging device from the plurality of middle point positions of the proximity pairs, and calculates an amount of position displacement between the selected middle point position and the target position of the imaging device.

* * * * *